United States Patent
Nakamura

[19]

[11] Patent Number: 5,906,472
[45] Date of Patent: May 25, 1999

[54] APPARATUS FOR REMOVING AND STORING SEMICONDUCTOR DEVICE TRAYS

[75] Inventor: Hiroto Nakamura, Kazo, Japan

[73] Assignee: Advantest Corporation, Tokyo, Japan

[21] Appl. No.: 09/061,469

[22] Filed: Apr. 16, 1998

[30] Foreign Application Priority Data

Apr. 17, 1997 [JP] Japan .................................... 9-099956

[51] Int. Cl.⁶ .................................................. B65G 59/06
[52] U.S. Cl. ...................... 414/798.1; 221/222; 221/297; 414/795.3
[58] Field of Search .................................... 221/221, 222, 221/223, 236, 237, 238, 297; 414/788.7, 795.3, 798.1

[56] References Cited

U.S. PATENT DOCUMENTS

| | | | |
|---|---|---|---|
| 4,715,501 | 12/1987 | Sato et al. ......................... | 414/795.3 X |
| 4,897,019 | 1/1990 | Lemaire et al. .................. | 414/798.1 X |
| 4,971,514 | 11/1990 | Hunter ................................. | 414/795.3 |

FOREIGN PATENT DOCUMENTS 3-243530  10/1991  Japan .................................. 414/798.1

*Primary Examiner*—Janice L. Krizek
*Attorney, Agent, or Firm*—Gallagher & Lathrop; David N. Lathrop

[57] ABSTRACT

A tray removing apparatus is provided which is capable of automatically removing trays loaded with ICs to be tested from a tray storage container open only at its bottom and delivering the trays to an IC testing apparatus, and a tray storing apparatus is also provided which is capable of storing trays loaded with tested ICs into the tray storage container. Stacked trays KST taken out of the tray storage container KAS are supported by first engagement hooks 12A, and an elevator 14 is brought into abutment against the bottom of the stacked trays. In such condition, the first engagement hooks are released from their engagement with the stacked trays and second engagement hooks 12B disposed at an elevation lower than the first engagement hooks by one tray thickness are moved to the engaged position. The elevator is lowered to support the stacked trays by the second engagement hooks, and in this condition the first engagement hooks are moved into engagement with the second lowermost one of the stacked trays while the second engagement hooks are moved to the non-engaged position, and then the elevator is lowered to take out only the lowermost one of the stacked trays.

7 Claims, 12 Drawing Sheets

APPARATUS FOR REMOVING AND STORING SEMICONDUCTOR DEVICE TRAYS

BACKGROUND OF THE INVENTION

1. Field of the Invention

The present invention relates to a semiconductor device tray removing apparatus suitable for use to automatically remove trays stored in a tray storage container for automatically delivering semiconductor devices loaded on the trays to a semiconductor device testing apparatus and to a semiconductor device tray storing apparatus suitable for use to automatically store trays loaded with tested semiconductor devices in the tray storage container.

2. Description of the Related Art

Many semiconductor device testing apparatuses for measuring the electrical characteristics of semiconductor devices to be tested, i.e. devices under test (commonly called DUT), by applying signals of a test signal of a predetermined pattern to the devices, have a semiconductor device handling (transporting and processing) apparatus (commonly called handler) integrally connected thereto for transporting semiconductor devices to a testing or test station where they are brought into electrical contact with sockets of the test head of the testing apparatus, followed by carrying the tested semiconductor devices out of the testing station and sorting them out into conforming (pass) and non-conforming (failure or defective) articles on the basis of the test results.

In the following disclosure the present invention will be described by taking semiconductor integrated circuits (as will be referred to as IC hereinafter) typical of semiconductor devices by example for the convenience of explanation. The term "semiconductor device testing apparatus" (IC testing apparatus) as used herein generally means both the semiconductor device testing apparatus (IC testing apparatus) having no handler connected thereto and the semiconductor device testing apparatus (IC testing apparatus) having a handler connected thereto.

With an increased number of IC terminal pins attendant with an enhanced level of the IC integrity, in the semiconductor device testing apparatus (as will be referred to as IC testing apparatus hereinafter) having incorporated therein a handler of the gravity-dropping type in which ICs are allowed to slide down a slanted transport path by their own weight to undergo a test, it has been difficult to test ICs with an increased number of terminals because of the difficulty to allow such numerous-pinned ICs to slide naturally. For this reason, in recent years the IC testing apparatus has integrated therewith a handler called "forced horizontal transporting system" capable of picking up ICs with a vacuum pick-up head and transporting the picked up ICs to any desired location by the use of X-Y direction transport means.

Typically, there have been heretofore put in practical use the following two types of the IC testing apparatus having a handler incorporated therein:

(1) The type in which a tray loaded with a number of ICs arranged in a plane is placed at a predetermined position in the IC testing apparatus, followed by a predetermined number of ICs being picked up from the tray by a vacuum pick-up head, the thus picked up ICs being transported by an X-Y direction transport means sequentially to a preheating section and then to a test section where the ICs are subjected to a test, whereafter the tested ICs are sorted out into conforming and non-conforming articles before they are returned to trays by the use of the X-Y direction transport means.

(2) The type in which a number of ICs are loaded in a planar array on a universal tray (customer tray ) (which is designed to be used by the user to transport and store ICs in a desired area outside of the IC testing apparatus) and then the universal tray loaded with the ICs is placed in the loader section of the IC testing apparatus where the ICs are transferred from the universal tray onto a test tray capable of withstanding high and low temperatures, followed by the test tray being transported through a constant temperature chamber to a test section where the ICs as loaded on the test tray are brought into electrical contact with IC sockets of a tester head to undergo a test, upon completion of the test the test tray being conveyed through a temperature stress removing chamber out to an unloader section where the tested ICs are sorted out into conforming and non-conforming articles before they are transferred to universal trays.

The IC testing apparatus having the former type (1) of handler is rather slow in the processing speed and hence requires a relatively long time for testing since the number of ICs which can be tested at a time is limited to two to four. In other words, the IC testing apparatus of the type (1) is not suitable for high speed processing. In contrast, the IC testing apparatus having the latter type (2) of handler permits ICs as loaded on the test tray to be put into electrical contact with IC sockets of the tester head in the test section, so that it is possible to test as many ICs as sixteen, thirty-two or sixty-four, for example, at a time. Therefore, the general trend at present is toward the use of the IC testing apparatus having the latter type (2) of handler.

First, the general construction of the prior art IC testing apparatus having the latter type (2) of handler integrated therewith will be described with reference to FIGS. 6 and 7. The illustrated IC testing apparatus comprises a chamber section 100 for testing ICs such as semiconductor memories which have been brought in as loaded on a test tray TST, an IC storage section 200 for storing ICs to be tested (ICs under test) and ICs already tested and sorted, a loader section 300 where ICs to be tested which a user has beforehand loaded on universal trays (customer trays) KST are transferred and reloaded onto a test tray TST capable of withstanding high/low temperatures, and an unloader section 400 where the tested ICs which have been carried on the test tray TST out of the chamber section 100 subsequently to undergoing a test therein are transferred from the test tray TST to the universal trays KST to be reloaded on the latter. The unloader section 400 is generally configured to sort out tested ICs based on the data of the test results and load them on the corresponding universal trays.

The chamber section 100 comprises a constant temperature or thermostatic chamber 101 for imposing temperature stresses of either a designed high or low temperature on ICs under test loaded on a test tray TST, a test chamber 102 for conducting electrical tests on the ICs under the temperature stress imposed in the constant temperature chamber 101, and a temperature stress removing chamber 103 for removing the temperature stress imposed in the constant temperature chamber 101 from the ICs having undergone the tests in the test chamber 102. The test chamber 102 contains therein the tester or test head 104 of the IC testing apparatus, the test head 104 serving to apply various testing electric signals to the ICs electrically contacted with the IC sockets thereof and to receive response signals from the ICs and transmit same to the IC testing apparatus.

The test tray TST is moved in a circulating manner from and back to the loader section 300 sequentially through the constant temperature chamber 101, the test chamber 102 and the temperature stress removing chamber 103 of the chamber section 100, and the unloader section 400. The constant temperature chamber 101 and the temperature stress removing chamber 103 are taller than the test chamber 102 and have upper portions protruding beyond the top of the latter, as is apparent from FIG. 7. Spanning between these protruding upper portions of the constant temperature and temperature stress removing chambers 101, 103 is a base plate 105 as shown in FIG. 7 on which there is mounted a test tray transporting means 108 by which test trays TST are transported from the temperature stress removing chamber 103 toward the constant temperature chamber 101.

If ICs have had a high temperature applied thereto in the constant temperature chamber 101, the temperature stress removing chamber 103 cools the ICs with forced air down to the room temperature prior to delivering them out to the unloader section 400. If ICs have had a low temperature of, say, about −30° C. applied thereto in the constant temperature chamber 101, they are heated with heated air or a heater up to a temperature at which no condensation occurs prior to delivering them out to the unloader section 400.

A test tray TST, loaded with ICs being tested in the loader section 300, is conveyed from the loader section to the constant temperature chamber 101 of the chamber section 100 which is equipped with a vertical transport means adapted to support a plurality of (say, nine) test trays TST in the form of a stack. In the illustrated example, a test tray newly received from the loader section 300 is supported on the top of the stack. while the lowermost test tray is delivered out to the test chamber 102.

ICs to be tested are loaded with either a predetermined high or low temperature stress as the associated test tray TST is moved sequentially from the top to the bottom of the stack by the vertically downward movement of the vertical transport means and during a waiting period until the test chamber 102 is emptied. In the center of the test chamber 102 there is located the tester head 104. The test tray TST which has been carried one by one out of the constant temperature chamber 101 is placed onto the tester head 104 where a predetermined number of ICs out of the ICs under test loaded on the test tray are brought into electrical contact with IC sockets (not shown) disposed in the tester head 104, as will be discussed hereinbelow. Upon completion of the test on all of the ICs placed on one test tray through the tester head 104, the test tray TST is conveyed to the temperature stress removing chamber 103 where the tested ICs are relieved of heat to be restored to the room temperature prior to being delivered to the unloader section 400.

Like the constant temperature chamber 101 as described above, the temperature stress removing chamber 103 is also equipped with a vertical transport means adapted to support a plurality of (say, nine) test trays TST stacked one on another. In the illustrated example, a test tray newly received from the test chamber 102 is supported at the bottom of the stack while the uppermost test tray is discharged to the unloader section 400. The tested ICs are relieved of heat to be restored to the outside temperature (room temperature) as the associated test tray TST is moved successively from the bottom to the top of the stack by the vertically upward movement of the vertical transport means.

The tested ICs as carried on the test tray TST are passed to the unloader section 400 where they are sorted out by categories based on the data of the test results and transferred onto and stored in the corresponding universal trays KST. The test tray TST emptied in the unloader section 400 is delivered back to the loader section 300 where it is again loaded with ICs to be tested from the universal tray KST to repeat the same steps of operation.

As shown in FIG. 7, the IC transfer means for transferring ICs from the universal tray KST to the test tray TST in the loader section 300 may be in the form of X and Y direction transfer means 304 comprising a pair of opposed parallel rails 301 mounted on the base plate 105 in the loader section 300 and extending in the forward-rearward direction of the IC testing apparatus (referred to as Y direction herein), a movable arm 302 spanning and movably mounted at opposite ends on the pair of rails 301, and a carriage 303 mounted on the movable arm 302 for movement therealong longitudinally of the arm, that is, in the right to left direction of the testing apparatus (referred to as X direction herein). With this construction, the carriage 303 is movable in the Y direction between the universal tray KST and the test tray TST as well as in the X direction along the movable arm 302.

The carriage 303 has a vacuum pick-up head vertically movably mounted on its bottom surface. The movement of the carriage 303 in the X and Y directions and the downward movement of the vacuum pick-up head bring the vacuum pick-up head into abutment with the ICs placed on the universal tray KST to pick them up by vacuum suction for transfer from the universal tray KST to the test tray TST. The carriage 303 may be provided with a plurality of, say, eight vacuum pick-up heads so that eight ICs at a time may be transported from the universal tray KST to the test tray TST.

It is to be noted here that means 305 for correcting the orientation or position of an IC called "preciser" is located between the stop positions for the universal tray KST and test tray TST. The IC position correcting means or preciser 305 includes relatively deep recesses into which ICs as being attracted against the vacuum pick-up heads are released to fall prior to being transferred to the test tray TST. The recesses are each bounded by vertical tapered side walls which prescribe for the positions at which the ICs drop into the recesses by virtue of the tapering. Once eight ICs have been positioned relative to each other by the position correcting means 305, those accurately positioned ICs are again attracted against the vacuum pick-up heads and transferred to the test tray TST. The universal tray KST is provided with recesses for holding ICs which are sized larger as compared to the size of ICs, resulting in wide variations in positions of ICs stored in the universal tray KST. Consequently, if the ICs as such were vacuum picked up by the vacuum pick-up heads and transferred directly to the test tray TST, there might be some of them which could not be successfully deposited into the IC storage recesses m the test tray TST. This is the reason for requiring the position correcting means 305, as described above, which acts to arrange ICs as accurately as the array of the IC storage recesses in the test tray TST.

The unloader section 400 is equipped with two sets of X and Y direction transfer means 404 which are identical in construction to the X and Y direction transfer means 304 provided for the loader section 300. The X and Y direction transfer means 404 perform to transfer the tested ICs from the test tray TST delivered to the unloader section 400 onto the universal tray KST. Each set of the X and Y direction transfer means 404 comprises a pair of opposed parallel rails 401 extending in the forward-rearward direction of the testing apparatus (Y direction), a movable arm 402 spanning and movably mounted at opposite ends on the pair of rails 401, and a carriage 403 mounted on the movable arm 402 for movement therealong longitudinally of the arm, that is, in the right to left direction of the testing apparatus (X direction).

FIG. 8 shows the construction of one example of the test tray TST. The illustrated test tray TST comprises a rectangular frame 112 having a plurality of equally spaced apart parallel cleats 113 between the opposed side frame members 112a and 112b of the frame, each of the cleats 113 having a plurality of equally spaced apart mounting lugs 114 protruding therefrom on both sides thereof and each of the side frame members 112a, 112b opposing the adjacent cleats having similar mounting lugs 114 protruding therefrom. The mounting lugs 114 protruding from the opposed sides of each of the cleats 113 are arranged such that each of the mounting lugs 114 protruding from one side of the cleat 113 is positioned intermediate two adjacent mounting lugs 114 protruding from the opposite side of the cleat. Similarly, each of the mounting lugs 114 protruding from each of the side frame members 112a and 112b is positioned intermediate two adjacent mounting lugs 114 protruding from the opposed cleat. Formed between each pair of opposed cleats 113 and between each of the side frame members 112a and 112b and the opposed cleats are spaces for accommodating a multiplicity of IC carriers 116 in juxtaposition. More specifically, each IC carrier 116 is accommodated in one of an array of rectangular carrier compartments 115 defined in each of aforesaid spaces, each compartment 115 including two staggered, obliquely opposed mounting lugs 114 located at the diagonally opposed corners of the compartment. In the illustrated example wherein each cleat 113 has sixteen mounting lugs 114 on either side thereof, there are sixteen carrier compartments 115 formed in each of aforesaid spaces, in which sixteen IC carriers 116 are mounted. Since there are four of the spaces in the illustrated example, 16×4, that is, 64 IC carriers in total can be mounted in one test tray TST. Each of the IC carriers 116 is attached to two of the mounting lugs 114 by fasteners 117.

Each of the IC carriers 116 is of identical shape and size in its outer contour and has an IC pocket 119 formed in the center for accommodating an IC device therein. The shape of the IC pocket 119 of each IC carrier 116 is determined depending on that of the IC device to be accommodated therein. In the illustrated example the IC pocket 119 is in the shape of a generally square recess. The outer dimensions of the IC carrier 116 are sized so as to be loosely fitted in the space defined between the opposed mounting lugs 114 in the carrier compartment 115. The IC carrier 116 has flanges at its opposed ends adapted to rest on the corresponding mounting lugs 114, these flanges being formed therethrough with mounting holes 121 for receiving fasteners 117 therethrough and holes 122 for passing locating pins therethrough.

In order to prevent IC devices from slipping out of place within the IC carrier 116 or jumping out of the carrier, a pair of latches 123 are attached to the IC carrier 116, as shown in FIG. 9. These latches 123 are integrally formed with the body of the carrier so as to extend upwardly from the base of the IC pocket 119, and are normally resiliently biased such that the top end pawls urged toward each other by virtue of the resiliency of the resin material of which the carrier body is made. When the IC is to be deposited into or removed from the IC pocket 119, the top ends of the two latches 123 are expanded away from each other by a latch releasing mechanism 125 disposed on opposite sides of an IC suction 124 for picking up an IC device prior to effectuating the deposition of the IC into or removal from the IC pocket 119. Upon the latch releasing mechanism 125 being moved out of engagement with the latches 123, the latches will snap back to their normal positions where the deposited IC is held in place against dislodgement by the top end pawls of the latches 123.

The IC carrier 116 holds an IC device in place with its leads or pins 118 exposed downwardly as shown in FIG. 10. The tester head 104 is provided with an IC socket (not shown) having contacts 104A extending from the top surface thereof. The exposed pins 118 of the IC device are pushed against the contacts 104A of the IC socket to establish electrical connection between the IC device and the socket. To this end, a pusher 120 for pushing and holding an IC device down is mounted above the tester head 104 and is configured to push the IC device accommodated in an IC carrier 116 from above into contact with the IC socket of the tester head 104.

The number of IC devices which may be connected with the tester head 104 at a time depends on the number of IC sockets mounted on the tester head 104. By way of example, where sixty-four IC devices are carried in an array of 4 rows (horizontal lines)×16 columns (vertical lines) on a test tray TST as shown in FIG. 11, 4×4, that is, 16 IC sockets are arranged and mounted on the tester head 104 such that the IC devices (shown as cross-hatched) in every fourth column in each of the rows may be tested all at once. More specifically, in the first testing run the examination is conducted on sixteen IC devices located in the first, fifth, ninth and thirteenth columns in each row, the second testing run is effected on another sixteen IC devices located in the second, sixth, tenth and fourteenth columns in each row by shifting the test tray TST by a distance corresponding to one column of IC devices, and the third and fourth testing runs are carried out in the similar manner until all of the IC devices are tested. The test results are stored in a memory with the addresses determined by the serial numbers (serial numbers in one lot) assigned to the ICs, the identification number affixed to the test tray TST and the numbers assigned to the IC pockets in the test tray. It is to be appreciated that where thirty-two IC sockets may be mounted on the tester head 104, only two testing runs are required to examine all sixty-four ICs arranged in an array of 4 rows×16 columns.

It is also to be noted that there is another type of IC handler in which ICs to be tested are transferred from the test tray into a socket of the tester head for the test and upon the test being completed the ICs are transferred from the socket back onto the test tray for delivery, in the test chamber 102.

The IC storage section 200 comprises an IC (DUT) storage rack (or stocker) 201 for accommodating universal trays KST loaded with ICs being tested and a tested IC storage rack (or stocker) 202 for accommodating universal trays KST loaded with tested ICs sorted out by categories on the basis of the test results. The IC storage rack 201 and tested IC storage rack 202 are configured to accommodate universal trays in the form of a stack. The universal trays KST with ICs under test carried thereon stored in the form of a stack in the IC storage rack 201 are transported successively from the top of the stack to the loader section 300 where the ICs being tested are transferred from the universal trays KST onto a test tray TST on standby in the loader section 300.

The IC storage rack 201 and the tested IC storage rack 202, one of which is shown in FIG. 12, may be of identical construction and comprise a tray supporting frame 203 open at the top and having an opening at the bottom, and an elevator 204 disposed below the frame 203 so as to be vertically movable through the bottom opening. In the tray supporting frame 203 there are stored and supported a plurality of universal trays KST stacked one on another which are vertically moved by the elevator 204 acting through the bottom opening of the frame 203.

In the example illustrated in FIGS. 6 and 7, eight racks STK-1, STK-2, . . . , STK-8 are provided as tested IC storage racks 202 so as to be able to store tested ICs which may be sorted out into eight categories at a maximum according to the test results. This is because in some applications tested ICs may not only be classified into categories of "pass article" and "failure article" but also be subclassified into those having high, medium and low operation speeds among the "pass" articles and those required to be re-tested among the "failure" articles, and others. Even if the number of classifiable categories is up to eight, the unloader section 400 in the illustrated example is capable of accommodating only four universal trays KST. For this reason, if there occur some among the tested ICs which should be classified into a category other than categories assigned to the four universal trays KST arranged in the unloader section 400, the procedures taken are to return one of the universal trays KST from the unloader section 400 to the tested IC storage section 200 and in replacement transfer a universal tray KST for storing the ICs belonging to the new additional category from the tested IC storage section 200 to the unloader section 400 where those ICs are stored in the new tray.

Referring to FIG. 7, a tray transfer means 205 is disposed above the IC storage rack 201 and the tested IC storage racks 202 for movement over the entire extent of the storage racks 201 and 202 in the direction of arrangement of the racks (in the right to left direction of the testing apparatus) relative to the base plate 105.

FIG. 13 illustrates one example of the positional relation between the tray supporting frame 203 of the IC storage rack 201, the elevator 204 and the tray transfer means 205. The tray transfer means 205 is provided on its bottom with grasp means in the form of pivotable pawls 205A for grasping a universal tray KST. The tray transfer means 205 is moved to a position over the IC storage rack 201 whereupon the elevator 204 is actuated to lift the universal trays KST stacked in the IC storage rack 201, so that the uppermost universal tray KST may be engaged and grasped by the pivotable pawls 205A of the tray transfer means 205. (Each universal tray KST is formed in its sides with cutouts for receiving the pivotable pawls 205A.)

Once the uppermost universal tray KST loaded with ICs being tested has been transferred to the tray transfer means 205, the elevator 204 is lowered to its original position. The tray transfer means 205 is then horizontally moved along guide means 210 to and stopped at a predetermined position in the loader section 300 by means of power transmission means such as chains or wires where the tray transfer means 205 has its pivotable pawls 205A release the universal tray KST to allow it to drop into an immediately underlying tray receiver 207. The tray transfer means 205 having the universal tray KST unloaded therefrom is moved out of the loader section 300 again by the power transmission means.

Then, the elevator 204 is moved upward from below the tray receiver 27 having the universal tray KST placed thereon to lift up the universal tray KST loaded with ICs to be tested so that the universal tray KST is held with its upper surface facing a window 106 formed in the base plate 105 (with the upper surface of the universal tray KST exposed through the window). More specifically, pivotable pawls 208 for grasping a universal tray KST are mounted on the undersurface of the base plate 105 around the window 106, so that the universal tray KST is held in the aforesaid condition by the pivotable pawls 208 engaging in the cutouts of the universal trays KST loaded with ICs to be tested. In this condition, the ICs to be tested are loaded from the universal tray KST through the window 106 onto the test tray TST.

The base plate 105 is also formed in the area overlying the unloader section 400 with another two similar windows 106. In this example, each of the windows 106 is sized to allow the upper surfaces of two juxtaposed universal trays to face the window. Hence, the arrangement is such that tested ICs may be stored through the two windows 106 of the unloader section 400 into four empty universal trays.

As shown in FIG., 13, pivotable pawls 208 for grasping a universal tray KST are also mounted on the undersurface of the base plate 105 around the windows 106 of the unloader section 400, so that universal trays KST may be grasped by the pivotable pawls 208. Tested ICs are sorted and stored in these empty universal trays KST according to the categories assigned to respective trays.

Although not shown in FIG., 13, as with the loader section 300, the unloader section 400 is also provided with tray receivers and associated elevators 204 for temporarily keeping (supporting thereon) universal trays KST. Once one universal tray KST has been fully filled, the elevator 204 is moved up to support the tray whereupon the tray is released from the engagement with the pivotable pawls 208. Then, as the elevator 204 is moved down, the universal tray KST is lowered from the level below the window 116 to be temporarily placed on the tray receiver, and is subsequently stored in the tray storage position assigned to that particular tray by the tray transfer means 205.

Indicated by the numeral 206 in FIGS. 6 and 7 is an empty tray storage rack (or stocker) for accommodating empty universal trays KST. From this empty tray storage rack 206, empty universal trays are transported to the respective windows 106 by the tray transfer means 205 and held thereat by the associated elevators 204 to be ready for receiving tested ICs.

As discussed above with reference to FIG. 12, it has been heretofore a common practice to manually store universal trays KST from above the tray supporting frame 203 down into the IC storage rack 201 and to automatically take out universal trays KST out of the IC storage rack 201 from above the tray supporting frame 203 and transport them to the loader section 300 by the use of the transport mechanism of the handler.

In contrast, a tendency is seen lately to employ a tray storage container KAS as shown in FIG. 14 which is open only at the lower end (bottom) thereof with movable L-shaped hooks FK mounted on a pair of opposed end edges of the container. Specifically, the vertical legs of the movable L-shaped hooks FK are pivotally mounted on the opposed end edges of the container such that the horizontal legs of the respective hooks may extend into the open end of the tray storage container KAS.

With this construction, the movable hooks FK may be pivoted open outwardly to completely open the open end of the tray storage container KAS to permit a predetermined number of universal trays KST to be stored in the tray storage container KAS, whereafter upon the movable hooks FK being returned to their original positions, these universal trays KST are stored in a vertical stack within the tray storage container KAS as the lowermost universal tray KST of the stack is supported on its bottom surface adjacent the opposed end edges thereof by the movable hooks FK. Attached to the top of the tray storage container KAS is a handle HD which may be used to carry the tray storage container KAS.

The use of the tray storage container KAS constructed as described above makes it possible to store a predetermined number of universal trays KST in the tray storage container KAS at a time without resort to manual operation if the tray storage container KAS with its movable hooks FK pivoted open outwardly is lowered from above to enclose a vertical stack of universal trays KST (each loaded with ICs) followed by returning the movable hooks FK to their original positions to engage with the bottom surface of the lowermost universal tray KST of the stack.

If the tray storage container KAS in is condition is lifted up, the universal trays KST may be transported as they are stored in place in the form of a stack in the tray storage container KAS. When the trays are unloaded, the tray storage container KAS may be lowered down to a location where the trays are to be unloaded, and at that location the movable hooks FK are pivoted open outwardly to completely open the open end of the tray storage container KAS so that the container may be removed (lifted up) to leave the vertically stacked trays at that location. In this manner the universal trays may be unloaded at a desired location at a time without resort to manual operation.

It will thus be appreciated that in addition to transporting trays, whether empty or loaded with ICs, in a safe manner, the use of the tray storage container KAS constructed as described above provides the advantage of providing for loading and unloading of trays at a time without resort to manual operation, thereby greatly facilitating the operations of loading and unloading trays.

However, the tray storage container KAS as illustrated in FIG. 14 has the disadvantage that it cannot be directly installed in the conventional IC testing apparatus (specifically the handler) as described above with reference to FIGS. 6–12, since such tray storage container is configured to store and take out trays through the bottom side.

SUMMARY OF THE INVENTION

It is an object of the present invention to provide a semiconductor device tray removing apparatus which is capable of removing trays loaded with semiconductor devices to be tested from a tray storage container open only at its bottom and delivering the trays to a semiconductor device testing apparatus.

It is another object of the present invention to provide a semiconductor device tray storing apparatus which is capable of storing trays loaded with tested semiconductor devices successively one by one into a tray storage container open only at its bottom.

According to a first aspect of the present invention, a semiconductor device tray removing apparatus is provided which comprises: a tray storage container supporting section for resting thereon a tray storage container open at the bottom thereof and provided on the end edges of the open bottom with movable hooks, said tray storage container being capable of supporting a predetermined number of trays stacked one on another in the form of a stack by said movable hooks being placed in their engaged position, each tray being loaded with semiconductor devices to be tested; elevator means disposed below said tray storage container supporting section and adapted to receive said stacked trays discharged from said tray storage container by said movable hooks being placed into their non-engaged position and to move said stacked trays or any one or more trays received thereon vertically; first engagement hook means movable between an engaged position in which said first engagement hook means is in engagement with any one or more trays as the trays, placed on said elevator means, move vertically and a non-engaged position in which said first engagement hook means is not in engagement with any one or more trays; second engagement hook means disposed at an elevation lower than said first engagement hook means by a distance corresponding to one thickness of the tray, and movable between an engaged position in which said second engagement hook means is in engagement with any one or more trays as the trays, placed on said elevator means, move vertically and a non-engaged position in which said second engagement hook means is not in engagement with any one or more trays; control means performing, in a predetermined sequence, the control operation of moving said first engagement hook means to said engaged position, lowering said elevator means to engage the lowermost one of said stacked trays rested on said elevator means with said first engagement hook means to thereby support said stacked trays by said first engagement hook means, the control operation of bringing said elevator means into abutment against the bottom surface of the lowermost one of said stacked trays while in this condition moving said first engagement hook means to said non-engaged position and moving said second engagement hook means to said engaged position, the control operation of lowering said elevator means to engage the lowermost one of said stacked trays with said second engagement hook means to thereby support said stacked trays by said second engagement hook means, the control operation, in the condition described just above, of moving said first engagement hook means to said engaged position so as to engage with the second lowermost one of said stacked trays while moving said second engagement hook means to said non-engaged position, and the control operation, in the condition described just above, of lowering said elevator means to lower only the lowermost one of said stacked trays; and transfer means for receiving said one tray lowered to a predetermined position by said elevator means and delivering said one tray to a semiconductor device testing apparatus.

In one preferred embodiment, said first and second engagement hook means disposed at elevations different by a distance corresponding to one thickness of the tray comprise a pair of integrally joined pivotable pawls extending in different directions such that one of said pawls is in said engaged position when the other pawl is in said non-engaged position and are pivotable about an axis intersecting perpendicularly with the plane of the tray, and each of said trays is generally rectangular and formed in opposed side surfaces thereof with recesses adapted to be engageable with said first and second engagement hook means, each of said recesses being open downwardly.

The aforesaid control means controls: upon said tray storage container being rested on said tray storage container supporting section, to move said first engagement hook means to said engaged position and to move said elevator means upwardly into abutment against the bottom surface of the lowermost one of said stacked trays; upon said elevator means receiving said stacked trays as they are discharged from said tray storage container while said elevator means is still in abutment against the bottom surface of the lowermost one of said stacked trays, to lower said elevator means to engage the lowermost one of said stacked trays with said first engagement hook means to thereby support said stacked trays by said first engagement hook means; then to bring said elevator means into abutment against the bottom surface of the lowermost one of said stacked trays, and with said elevator means maintained in abutment against the bottom surface, to move said first engagement hook means to said non-engaged position and at the same time to move said second engagement hook means to said engaged position; then to lower said elevator means by a distance corresponding to one thickness of the tray to engage the lowermost one of said stacked trays with said second engagement hook means to thereby support said stacked trays by said second engagement hook means while maintaining said elevator means in abutment against the bottom surface of the lowermost one of said stacked trays, then to move said first engagement hook means to said engaged position so as to engage with the second lowermost one of said stacked trays and to move said second engagement hook means to said non-engaged position to thereby support the lowermost one tray by said elevator means; and then to lower said elevator means to lower only the lowermost one of said stacked trays to a predetermined position.

According to a second aspect of the present invention, a semiconductor device tray storing apparatus is provided which comprises: a tray storage container supporting section for resting thereon a tray storage container open at the bottom thereof and provided on the end edges of the open bottom with movable hooks, said tray storage container being capable of supporting a predetermined number of trays stacked one on another in the form of a stack by said movable hooks being placed in their engaged position, each tray being loaded with tested semiconductor devices; elevator means disposed below said tray storage container supporting section and adapted to receive a tray delivered by transfer means of a semiconductor device testing apparatus, said tray being loaded with tested semiconductor devices, and then to lift trays up successively; first engagement hook means movable between an engaged position in which said first engagement hook means is in engagement with a tray as said tray, placed on said elevator means, moves upwardly and a non-engaged position in which said first engagement hook means is not in engagement with said tray; second engagement hook means disposed at an elevation higher than said first engagement hook means by a distance corresponding to one thickness of the tray, and movable between an engaged position in which said second engagement hook means is in engagement with a tray as said tray, placed on said elevator means, moves upwardly and a non-engaged position in which said second engagement hook means is not in engagement with said tray; and control means performing, in a predetermined sequence, the first control operation of moving said first engagement hook means to said non-engaged position, raising said elevator means to lift the tray placed on said elevator means up to the elevation of said second engagement hook means and then moving said second engagement hook means to said engaged position to engage with said tray placed on said elevator means to thereby support said tray by said second engagement hook means, the second control operation of raising said elevator means carrying the next succeeding tray thereon into abutment against the bottom surface of the preceding tray supported by said second engagement hook means while in this condition moving said first engagement hook means to said engaged position to engage with the lower succeeding tray and moving said second engagement hook means to said non-engaged position, the third control operation, in the condition described just above, of raising said elevator means by a distance corresponding to one thickness of the tray and moving said second engagement hook means to said engaged position to engage with said lower tray to thereby support the stacked trays by said second engagement hook means, and the fourth control operation of, upon said second and third control operations being repeated until a predetermined number of trays are stacked one on another on said elevator means, moving said elevator means to store the stacked trays into said tray storage container.

In one preferred embodiment, said first control operation by said control means includes moving said first engagement hook means to said non-engaged position, raising said elevator means to lift the tray placed on said elevator means up to the elevation of said first engagement hook means and then moving said first engagement hook means to said engaged position to engage with said tray placed on said elevator means to thereby support said tray by said first engagement hook means, and in this condition, further raising said elevator means by a distance corresponding to one thickness of the tray and then moving said second engagement hook means to said engaged position to engage with said tray placed on said elevator means to thereby support said tray by said second engagement hook means.

Said first and second engagement hook means disposed at elevations different by a distance corresponding to one thickness of the tray comprise a pair of integrally joined pivotable pawls extending in different directions such that one of said pawls is in said engaged position when the other pawl is in said non-engaged position and are pivotable about an axis intersecting perpendicularly with the plane of the tray, and each of said trays is generally rectangular and formed in opposed side surfaces thereof with recesses adapted to be engageable with said first and second engagement hook means, each of said recesses being open downwardly.

With the construction of the present invention according to the first aspect described above, universal trays loaded with semiconductor devices to be tested and stored in a tray storage container open only at its bottom may be automatically removed from the tray storage container to deliver the universal trays to the loader section of the semiconductor device testing apparatus.

With the construction of the present invention according to the second aspect described above, universal trays loaded with tested semiconductor devices may be received successively one by one and stacked one on another, and then the thus stacked trays may be stored into a tray storage container which is accessible through its bottom for storing and removing trays.

It is thus to be appreciated that the present invention provides the advantage of allowing for automation of all of the operations including the operation of delivering semiconductor devices to be tested to a semiconductor device testing apparatus and the operation of storing tested semiconductor devices, even if a tray storage container accessible through its bottom for storing and removing trays is used.

DETAILED DESCRIPTION OF THE PREFERRED EMBODIMENTS

The embodiment of the present invention will be described in detail with reference to FIGS. 1 to 5.

Figure 1:
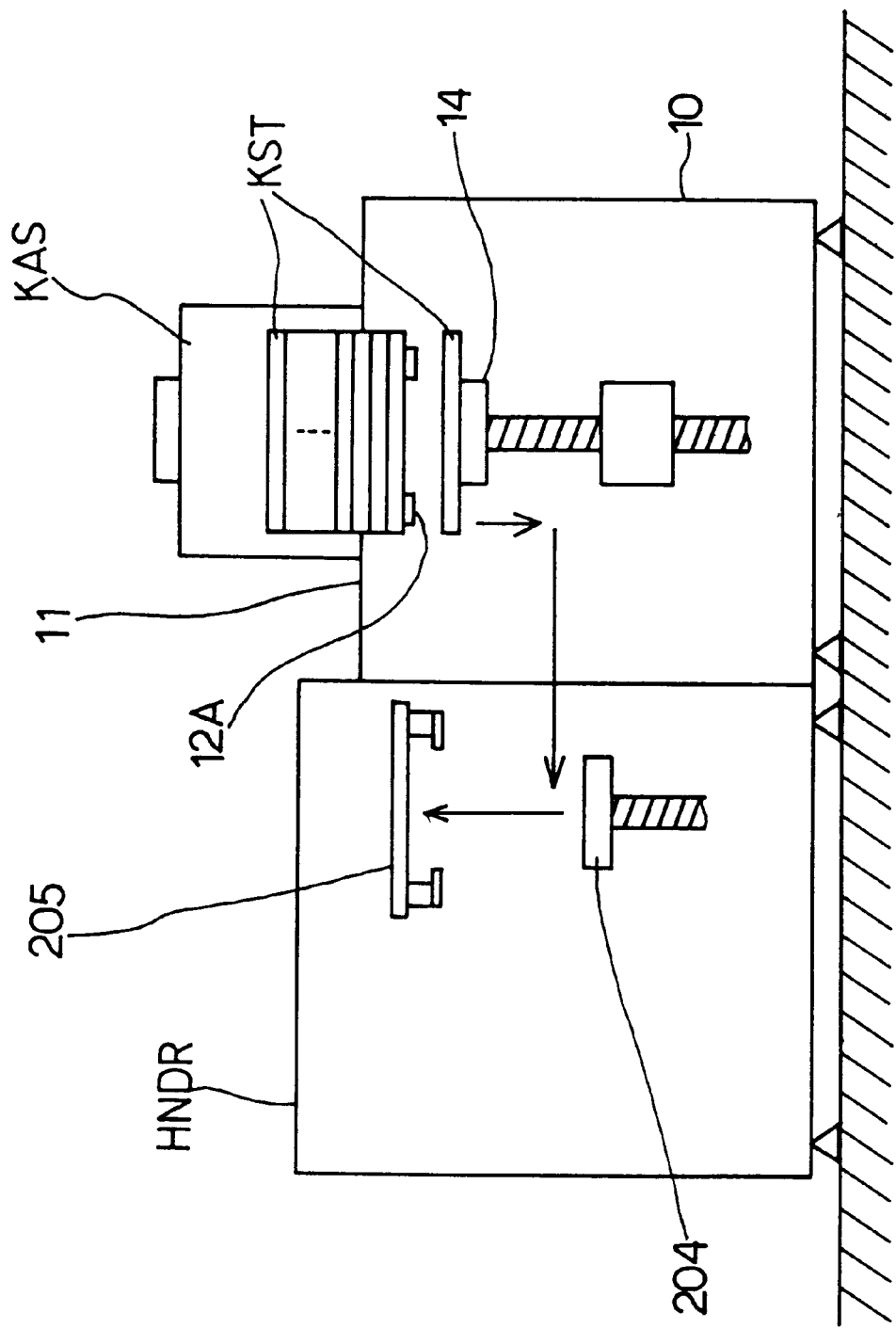
FIG. 1 is a schematic side view illustrating the configuration of an embodiment of the semiconductor device tray removing apparatus according to the present invention.

FIG. 1 is a side view illustrating the positional relation between the prior art IC testing apparatus already discussed with reference to FIGS. 6 and 7 and an embodiment of the semiconductor device tray removing apparatus according to the present invention (IC tray removing apparatus in this embodiment), and only the handler HNDR of the IC testing apparatus is shown.

The IC tray removing apparatus in this embodiment is disposed in juxtaposition with the handler HNDR of the IC testing apparatus such that it may perform the operation of delivering the universal trays KST as removed from a tray storage container KAS successively one by one to the handler HNDR. It should be noted here that although not shown herein, the semiconductor device tray storing apparatus according to the present invention (IC tray storing apparatus when used in conjunction with the IC testing apparatus) receives trays KST loaded with tested ICs as delivered from the handler HNDR of the IC testing apparatus shown in FIG. 1 and stores the trays successively one by one into a tray storage container KAS.

First, referring to FIG. 1, the general construction and operation of the IC tray removing apparatus 10 according to one embodiment of the present invention will now be described. The illustrated IC tray removing apparatus 10 comprises a housing having on the top thereof an IC tray storage container supporting section 11 which is adapted to support thereon a tray storage container KAS containing a predetermined number of universal trays KST stacked one on another, each universal tray KST being loaded with ICs to be tested. Upon the tray storage container KAS being rested on the tray storage container supporting section 11, an elevator 14 disposed below the tray storage container supporting section 11 is moved upwardly until the pedestal mounted on the upper end of the elevator passes the space between the movable hooks FK (see FIG. 14) mounted on the opposed end edges of the tray storage container KAS and comes into abutment against the bottom surface of the lowermost universal tray KST of the stack. In this condition, the movable hooks FK on the end edges of the tray storage container KAS are pivoted open outwardly to completely open the open end of the container KAS to allow the universal trays KST contained in the form of a stack therein to be transferred onto the pedestal of the elevator 14.

The stacked universal trays KST are lowered by the downward movement of the elevator 14 to a predetermined position where the lowermost universal tray KST of the stack is engaged by first engagement hooks 12A disposed in the path of vertical movements of the elevator 14. It is thus to be understood that even if the elevator 14 is further moved down, the universal trays KST would be supported in place while they are stacked one on another by the engagement hooks 12A.

The stacked universal trays KS1 are separated one by one from the remaining ones successively starting with the lowermost tray and taken out of the container by the cooperative operation of the first engagement hooks 12A supporting the stack of universal trays and second engagement hooks 12B which will be described below with reference to FIG. 2. One universal tray KST removed in this manner is lowered by the elevator 14 to a predetermined position where it is rested on a tray carrier 18 which will be described below with reference to FIG. 4. The tray carrier 18 transports the universal tray KST carried thereon to the handler HNDR of the IC testing apparatus. The universal tray KST delivered to the handler HNDR is then placed on the pedestal on the upper end of the elevator 204 and lifted by the upward movement of the elevator 204 to be transferred onto the tray transfer means 205 described hereinabove with reference to FIG. 13. The tray transfer means 205 supports the transferred universal tray KST by the pivotable pawls 205A mounted on its bottom surface, and delivers the universal tray KT to the loader section 300 in the manner as described above with reference to FIG. 13.

The construction and operation of the various parts of the IC tray removing apparatus shown in FIG. 1 will now be described in details with reference to FIGS. 2 to 5.

Figure 2:
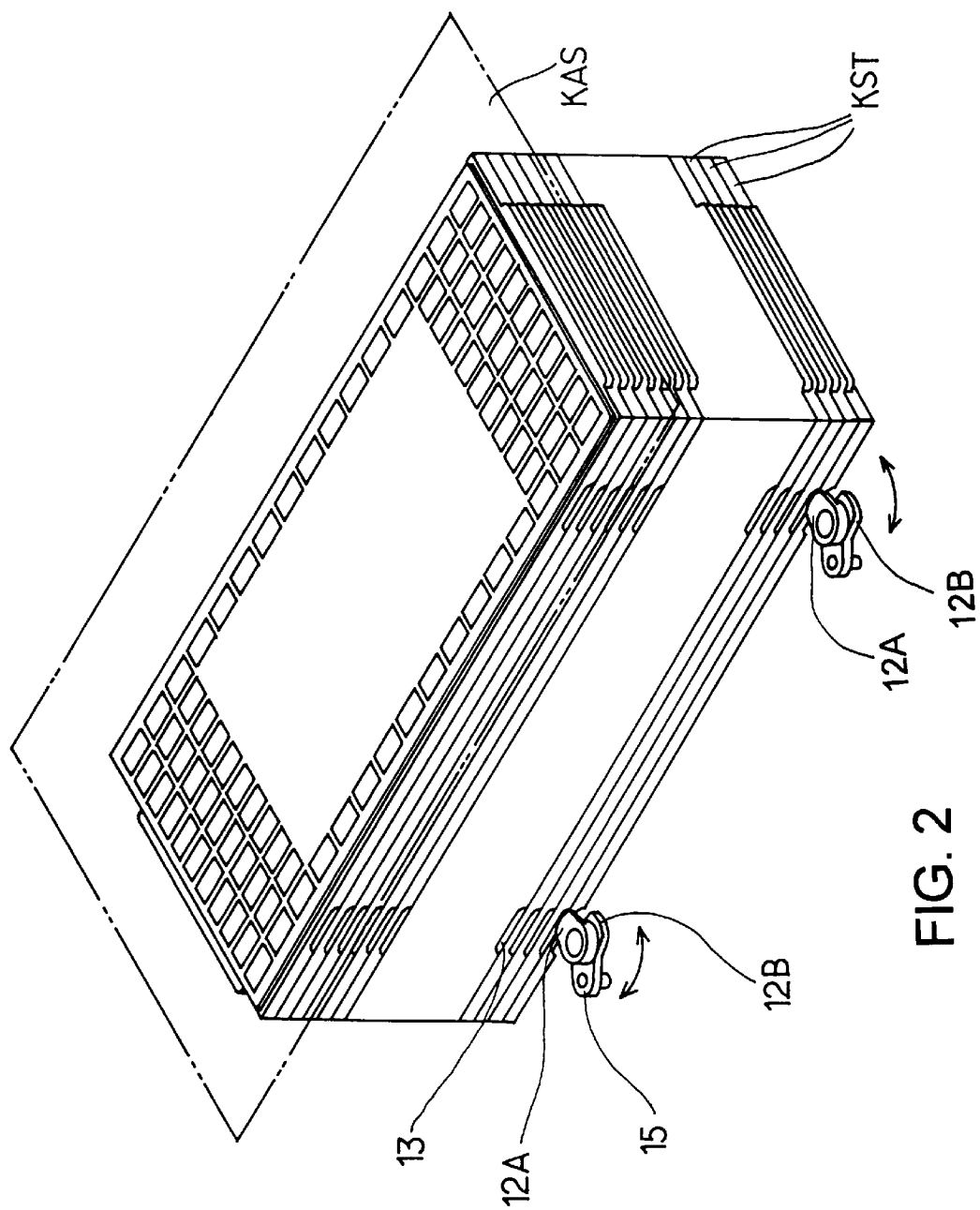
FIG. 2 is a perspective view illustrating the configuration of the principal parts of the semiconductor device tray removing apparatus shown in FIG. 1.

FIG. 2 is a schematic perspective view showing how the stacked universal trays KST are separated one by one from the remaining ones successively staring with the lowermost tray by the cooperative operation of the first engagement hooks 12A and second engagement hooks 12B disposed in the path of vertical movements of the elevator.

The first engagement hooks 12A and the second engagement hooks 12B in this example comprise pawls spaced vertically from each other by a distance corresponding to one thickness of the tray KST and extending in different directions (in directions different by 90° in the illustrated example) and are integrally connected together. That is, the two hooks 12A and 12B are pivoted in unison. In the illustrated example, the first engagement hooks 12A lie higher than the second engagement hooks 12B by one thickness of the tray while the second engagement hooks 12B are ahead of the first engagement hooks 12A by 90° in the clockwise direction. Each of the universal trays KST is formed in each of the opposite major side surfaces thereof with two notches 13 spaced apart from each other by a predetermined distance. The first engagement hooks 12A and the second engagement hooks 12B are pivotally mounted and adapted to be rotated by 90° clockwise and counterclockwise by means of a lever 15 formed integrally with the two hooks 12A and 12B. It should be understood that the second engagement hooks 12B may be behind the first engagement hooks 12A by 90° in the clockwise direction.

In this example, each of the notches 13 of the universal tray KST (which will be called simply "tray" hereinbelow, unless required) is in the form of a recess opening downwardly, so that as universal trays KST stacked one on another are lowered, the lowermost universal tray KST of the stack is automatically engaged by the first engagement hooks 12A as discussed above. In this example, the arrangement is such that the universal trays KST while maintained in the form of a stack are supported by four of the first engagement hooks 12A. Specifically in this example, the first engagement hooks 12A and the second engagement hooks 12B are initially in the position shown in FIG. 2 (it is noted in this example that each of the first engagement hooks 12A is in engagement with the notches 13 of the lowermost universal tray KST of the stack). However, it will be apparent to those skilled in the art that in the initial condition both of the first engagement hooks 1 2A and the second engagement hooks 12B are out of engagement with any of the trays so that rotation (90° in a clockwise direction, for example) of the hooks may bring the first engagement hooks 12A into engagement with the tray.

Figure 3:
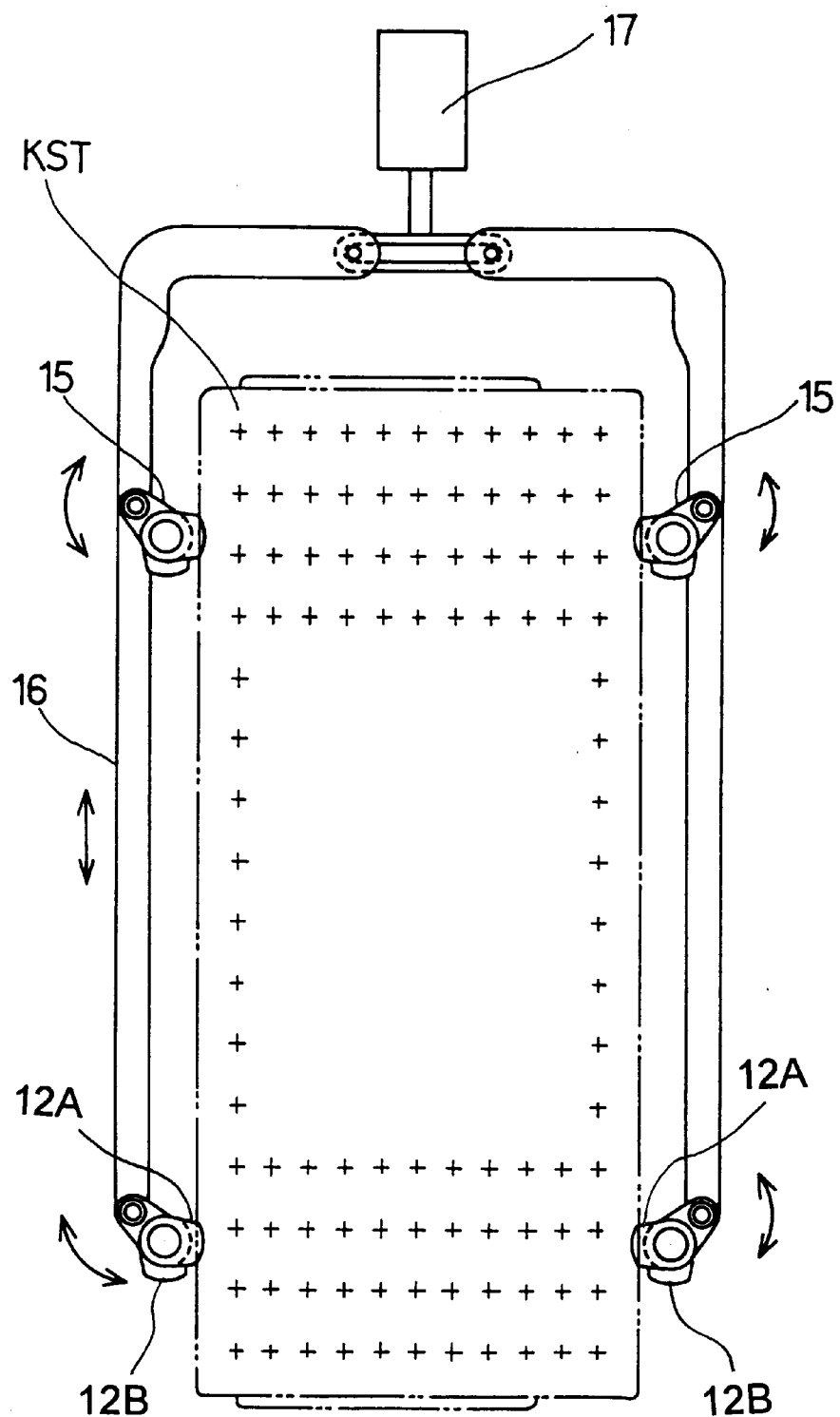
FIG. 3 is a plan view illustrating the operation of the principal parts of the semiconductor device tray removing apparatus shown in FIG. 1.

FIG. 3 illustrates one example of the arrangement in which the first engagement hooks 12A and the second engagement hooks 12B are rotated by 90° reciprocally or in an oscillatory manner in clockwise and counterclockwise directions. As described above, the first engagement hooks 12A and the second engagement hooks 12B are formed integrally with each other and the lever 15 is joined integrally with and extends from these hooks. As two of the levers 15 are formed in each of the opposed major sides of the tray, a pair of generally L-shaped operating bars 16 mirror-imaged with respect to each other are disposed with the longer legs of the bars extending along the respective major sides of the tray. The two levers 15 along a corresponding one of the major sides are interconnected by corresponding ones of the pair of operating bars 16 so that the four levers 15 may be simultaneously operated by the longitudinal movements of the pair of operating bars 16 along the major sides of the tray. In the illustrated example, the arrangement is such that the pair of operating bars 16 are driven by a linear drive means 17 to have their longer legs of the bars moved along the respective major sides of the tray to thereby rotate by 90° both the four first and second engagement hooks 12A, 12B.

In the condition where the first engagement hooks 12A lying higher by one thickness of the tray than the second engagement hooks 12B are in engagement with the notches 13 of the lowermost tray of the stack, a control means (not shown) is actuated to move the elevator 14 upwardly to lift the entire stack of trays up by a distance corresponding to one thickness of the universal tray so as to bear the total weight of the stacked trays on the elevator 14 prior to rotating the first engagement hooks 12A and the second engagement hooks 12B by 90° to turn the second engagement hooks 12B into engagement with the lowermost tray. Alternatively, in the condition where the pedestal of the elevator 14 is in abutment against the bottom surface of the lowermost tray, the first engagement hooks 12A and the second engagement hooks 12B may be rotated by 90° in the counterclockwise direction to turn the second engagement hooks 12B into engagement with the lowermost tray. In either case, in the condition where the trays are supported by the upper first engagement hooks 12A, the pedestal of the elevator 14 is moved up into abutment against the bottom surface of the lowermost tray to thereby slightly raise the stacked trays. Consequently, the load of the trays exerted on the first engagement hooks 12A is removed or greatly relieved, so that the advantage is obtained that the rotating movements of the first and second engagement hooks 12A, 12B may be facilitated.

In this condition, the control means is actuated to move the elevator 14 downwardly by the distance that it has just moved up (distance corresponding to one thickness of the tray), whereby the lowermost tray of the stack is brought into engagement with the second engagement hooks 12B so that the stack of the trays is supported by the second engagement hooks 12B. It is to be appreciated that in the case where the first engagement hooks 12A and the second engagement hooks 12B have been rotated by 90° with the pedestal of the elevator 14 in abutment against the bottom surface of the lowermost tray, the control operation may advantageously be simplified because the need for lowering the elevator 14 is eliminated.

Next, the control means is actuated to rotate the first engagement hooks 12A and the second engagement hooks 12B by 90° to turn the first engagement hooks 12A into engagement with the second lowermost tray (the second tray from the bottom of the stack), which condition is shown in FIG. 2.

Since in this condition the second engagement hooks 12B are turned out of engagement with the lowermost tray, the lowermost tray is allowed to drop onto the pedestal of the elevator 14. Then, the control means is again actuated to move the elevator 14 downwardly to carry only the lowermost tray together with the elevator 14 down to a predetermined position. The aforesaid procedures may be repeated whereby trays may be separated and removed one by one from a stack of trays.

Figure 4:
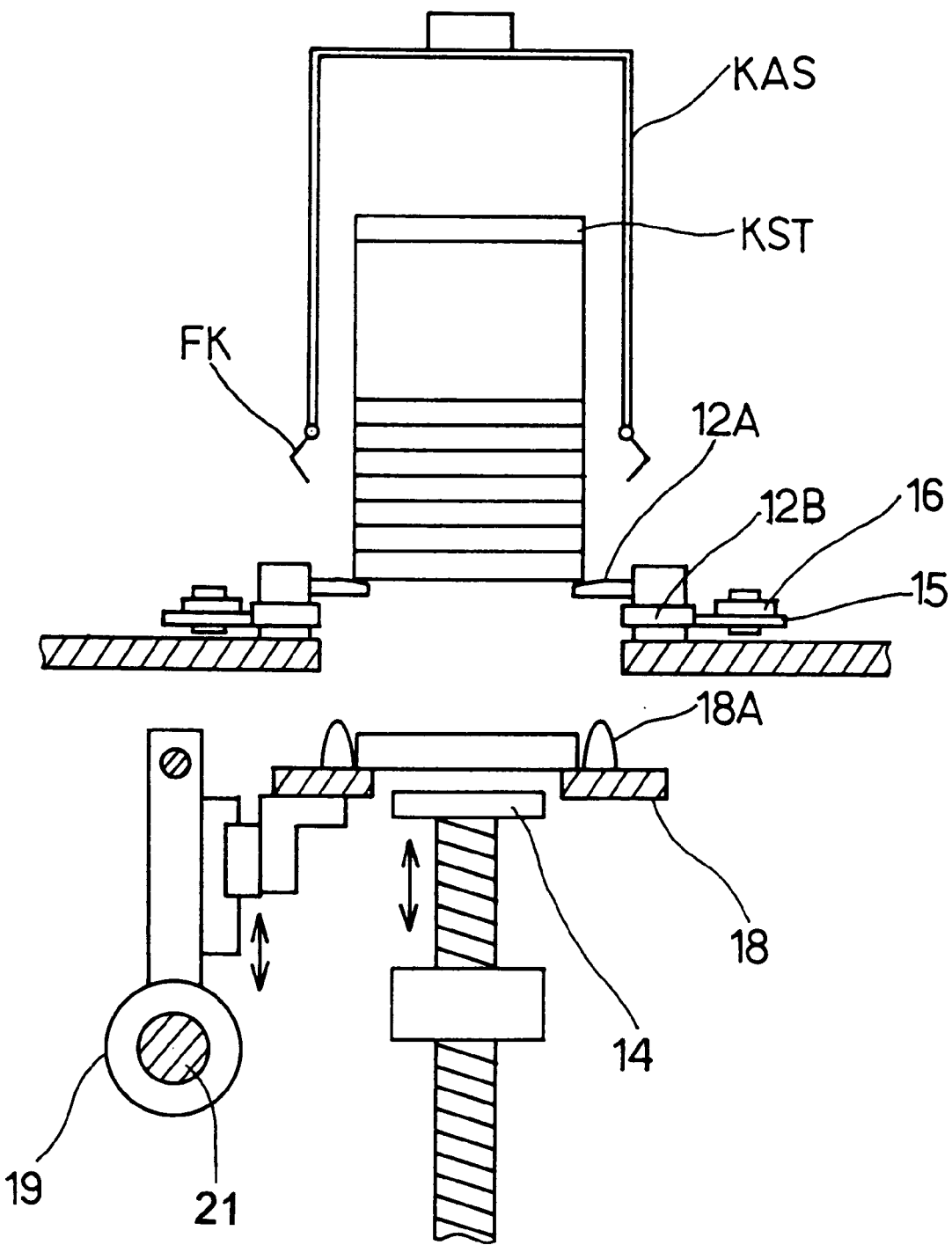
FIG. 4 is a schematic cross-sectional view illustrating one example of the practical use of the semiconductor device tray removing apparatus shown in FIG. 1.
Figure 5:
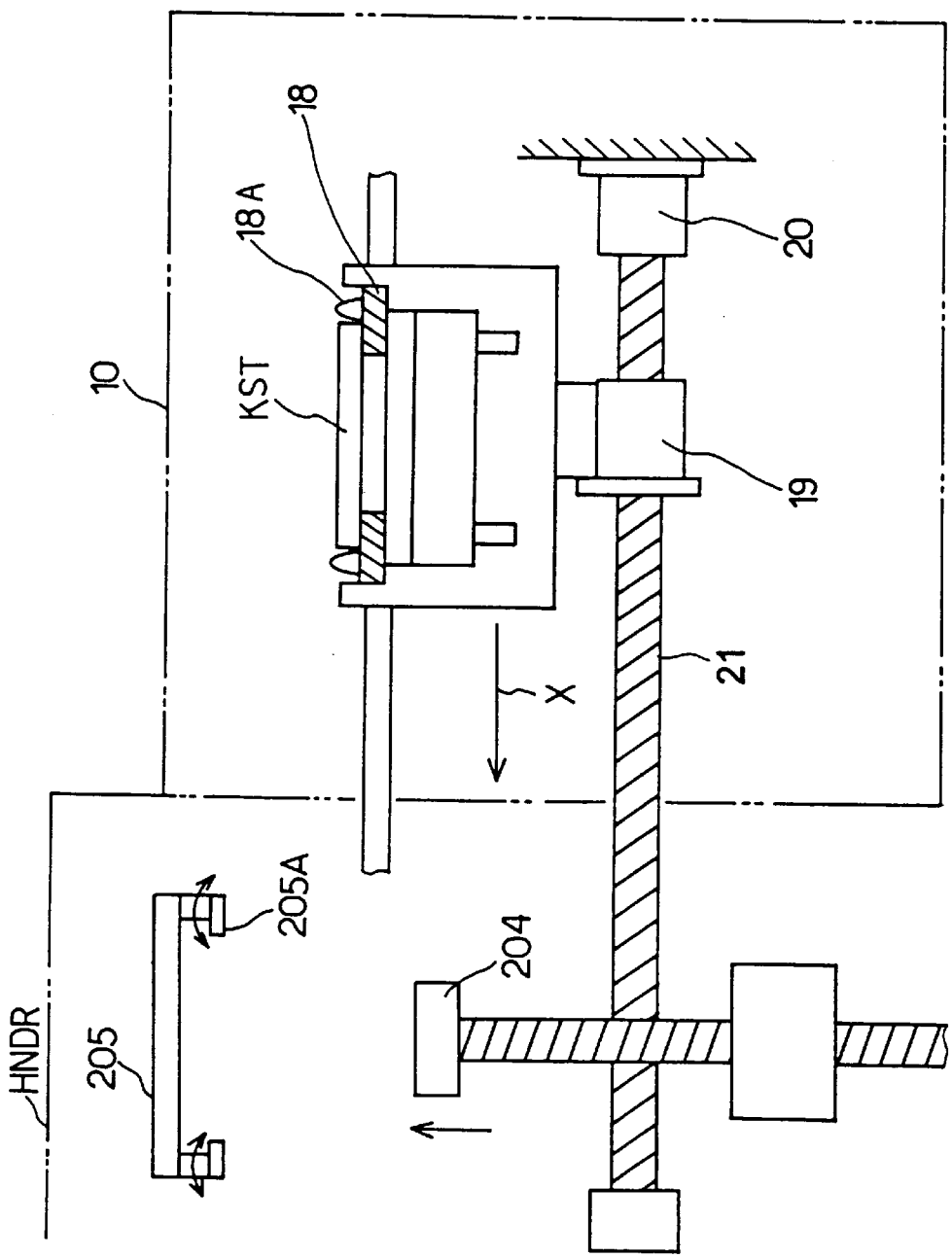
FIG. 5 is a schematic cross-sectional view taken from the left side of the semiconductor device tray removing apparatus shown in FIG. 4 illustrating the apparatus having the tray storage container removed therefrom.

FIGS. 4 and 5 are generally cross-sectional views illustrating one example of the practical use of the IC tray removing apparatus shown in FIG. 1. FIG. 5 illustrates the apparatus having the tray storage container KAS removed therefrom. It is to be understood that the tray storage container KAS may be removed from the IC tray removing apparatus while the trays contained in the container are supported by the first engagement hooks 12A, may be removed at a subsequent point of time, or may even be allowed to stand as it is.

The tray KST placed on the pedestal of the elevator 14 is transferred by the downward movement of the elevator 14 onto the tray carrier 18 which is located below the engagement hooks 12A, 12B, as shown in FIGS. 4 and 5. Upwardly extending from the upper surface of the tray carrier 18 are four guide pins 18A, two of which are spaced apart from each other by a spacing corresponding approximately to the length of the minor side of the tray KST and oppositely disposed approximately in the middle of the minor side and the other two of which are spaced apart from each other by a spacing corresponding approximately to the length of the major side of the tray KST and oppositely disposed approximately in the middle of the major side. It will be appreciated that these guide pins 18A act to accurately determine the orientation of the tray KST relative to the tray carrier 18 onto which the tray KST is to be loaded.

The tray carrier 18 is mechanically connected with a ball screw (having helical threads formed in the internal peripheral surface) 19 which is in turn in threaded engagement with a drive screw 21 (lead screw) having helical threads formed in the external peripheral surface so that rotation of the drive screw 21 moves the ball screw 19 which in turn moves the tray carrier 18. Specifically, the drive screw 21 is rotatively driven by a motor 20 as shown in FIG. 5 to move the ball screw 19 in a direction perpendicular to the plane of the drawing of FIG. 4 (horizontally in the right to left direction in FIG. 5), whereby the tray carrier 18 is moved in the X direction from the position shown in FIG. 5 to and stopped at a position over the elevator 204 disposed in the handler HNDR of the IC testing apparatus.

Figure 13:
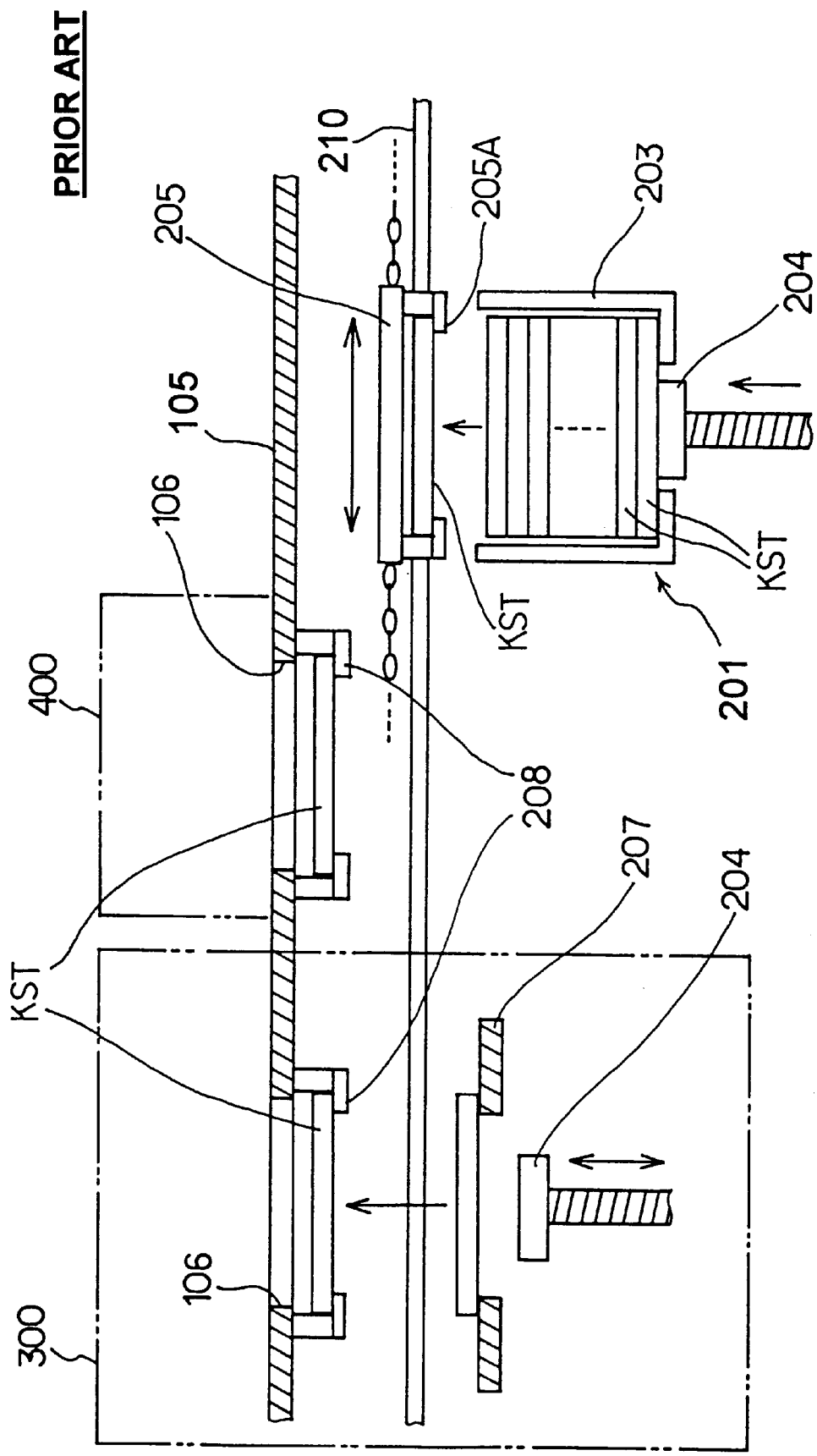
FIG. 13 is a schematic plan view illustrating one example of the construction of the tray transfer means used with the prior art IC testing apparatus.

On standby farther above the stop position for the tray carrier 18 over the elevator 204 is the tray transfer means 205 described hereinabove with reference to FIG. 13 while the elevator 204 is moved up to shift the tray KST carried on the tray carrier 18 a predetermined position below the tray transfer means 205. As explained hereinbefore, the tray transfer means 205 is provided on its bottom with pivotable pawls 205A, so that, upon the tray KST being moved up to the predetermined position below the tray transfer means 205, the pivotable pawls 205A are turned into engagement with the tray KST to grasp the latter. The tray transfer means 205 having grasped the tray KST then delivers the tray KST to the location of the window 106 in the loader section 300 shown in FIG. 13 or to the IC storage rack 201 shown in FIG. 6.

Figure 14:
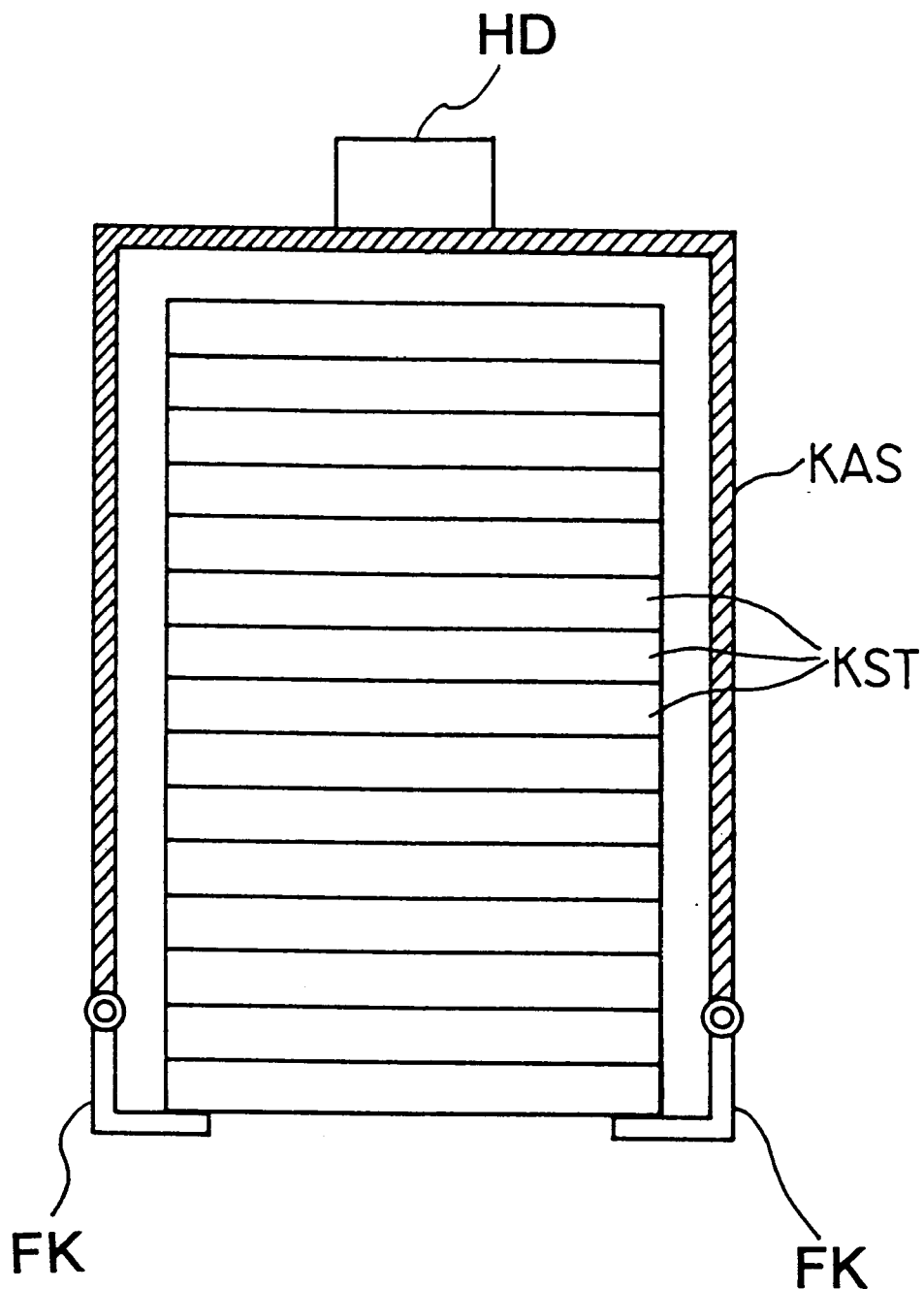
FIG. 14 is a cross-sectional view illustrating one example of the construction of the tray storage container.

The foregoing is a description of one embodiment of the tray removing apparatus according to the present invention for separating and removing trays one by one from a stack of trays stored in the tray storage container KAS open only at the bottom as shown in FIG. 14.

It will be appreciated that the use of the integrally joined first and second engagement hooks 12A, 12B as shown in FIG. 2 also provides for a tray storing apparatus for storing trays KST in the form of a stack into the tray storage container KAS open only at the bottom as shown in FIG. 14 wherein trays KST are stacked one on another from below as they are lifted up successively one by one from below the engagement hooks 12A, 12B by the elevator 14.

That is, each time one tray KST is lifted up by the elevator 14, the lower first engagement hooks 12B are pivoted into engagement with said tray to support the latter. (It is noted that the first engagement hooks 12A and the second engagement hooks 12B as termed with respect to the tray removing apparatus will be referred to as second engagement hooks and first engagement hooks, respectively in the tray storing apparatus.)

More specifically, the first engagement hooks 12B are initially turned away to such a position as not to interfere with a rising tray KST and the first one tray KST is raised by the elevator 14 up to the elevation of the lower first engagement hooks 12B, whereupon the first engagement hooks 12B and the second engagement hooks 12A are turned to engage the lower first engagement hooks 12B with the first tray to support the latter by the first engagement hooks 12B. In the next step, the elevator 14 is further moved up by a distance corresponding to one thickness of the tray (it should be reminded that as described above, the tray may be lifted even if it is released from engagement with the first engagement hooks 12B since the notches 13 open downwardly), and the first engagement hooks 12B and the second engagement hooks 12A are pivoted to engage the upper second engagement hooks 12A with the first tray, whereby the first tray is supported by the upper second engagement hooks 12A.

Alternatively, the first engagement hooks 12B and the second engagement hooks 12A may initially be turned away to such a position as not to interfere with a rising tray KST and the first one tray KST may be raised by the elevator 14 up to the elevation of the upper second engagement hooks 12A, whereupon the first engagement hooks 12B and the second engagement hooks 12A are turned to engage the upper second engagement hooks 12A with the first tray to support the latter by the upper second engagement hooks 12A.

The next tray is raised by the elevator 14 until it comes into abutment against the bottom surface of the first tray, whereupon the first engagement hooks 12B and the second engagement hooks 12A are turned to engage the first engagement hooks 12B with the second tray while at the same time the second engagement hooks 12A is disengaged from the first tray. It is thus to be understood that the second tray that has just been raised is stacked under the first tray. In this state, the elevator 14 is further moved up by a distance corresponding to one thickness of the tray to raise the two stacked trays by a distance corresponding to one thickness of the tray, whereupon the first engagement hooks 122B and the second engagement hooks 12A are pivoted to engage the upper second engagement hooks 12A with the second tray. The two trays stacked one on the other are thus supported by the upper second engagement hooks 12A.

The aforesaid procedures may be repeated whereby any additional tray as lifted up from below may be added to the lowermost one of trays stacked one on another. The newly added lowermost tray is supported by the upper second engagement hooks 12A, and hence the entire stack of trays is supported by the upper second engagement hooks 12A. It should be noted that in the case where one additional tray is delivered from below while being carried on the elevator 14 in the condition where the preceding stacked trays are supported by the upper second engagement hooks 12A, the preceding trays are slightly raised by the elevator 14 abutting against the bottom surface of the lowermost one of the upper stacked trays. Consequently, the load of the trays exerted on the second engagement hooks 12A is elimanated or greatly relieved, so that the advantage is obtained that the rotating movements of the first and second engagement hooks 12B, 12A may be facilitated.

The stacked trays supported by the upper second engagement hooks 12A may be delivered into the tray storage container KAS rested on the tray storage container supporting section 11 by further moving the elevator 14 upwardly. In this condition, the movable hooks FK on the end edges of the tray storage container KAS are pivoted to their closed positions to support the lowermost tray by the hooks FK. In this way, trays KST in the form of a stack may be stored into the tray storage container KAS.

Figure 6:
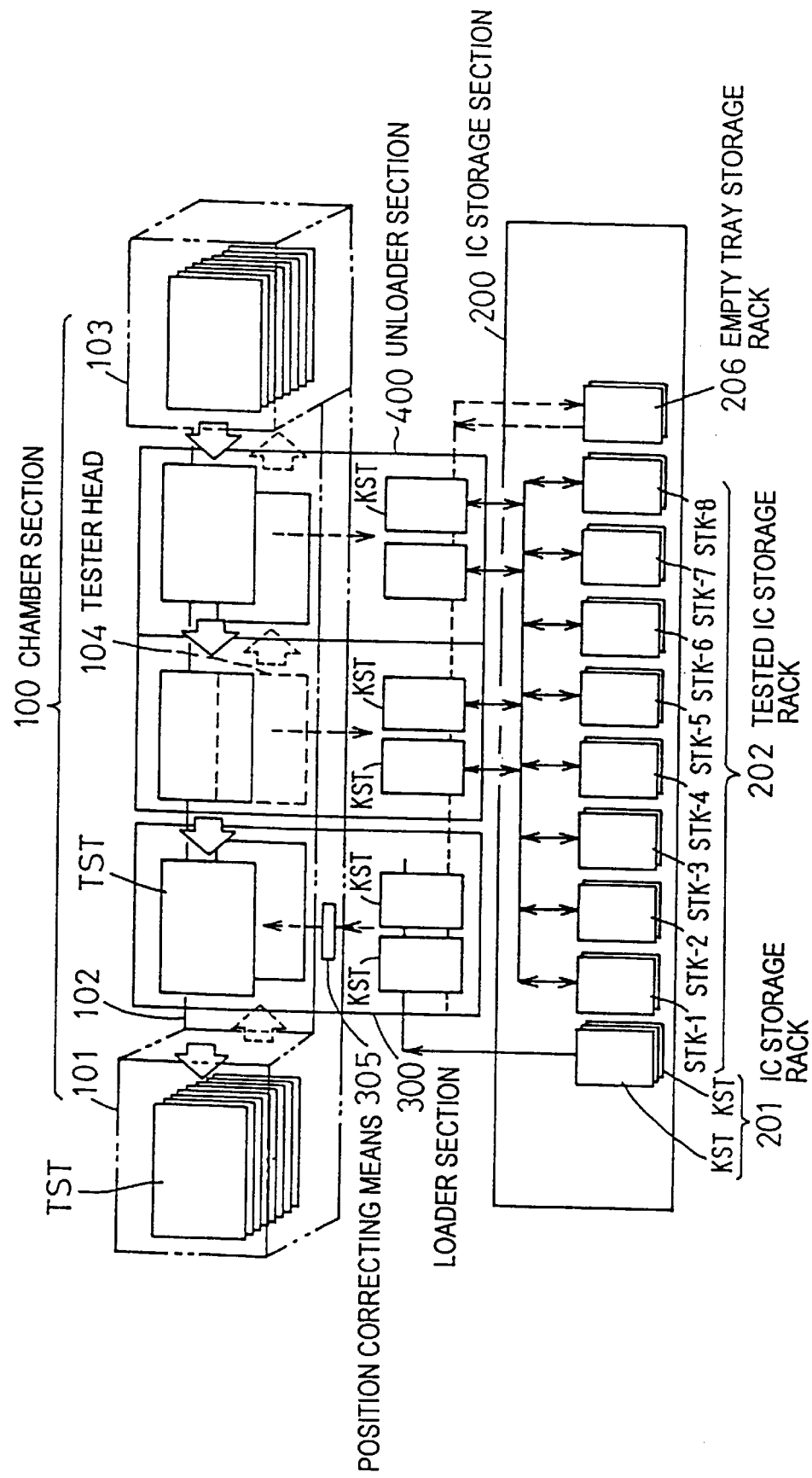
FIG. 6 is a schematic plan view of an example of the prior art IC testing apparatus with the chamber section shown in a perspective-like view.
Figure 7:
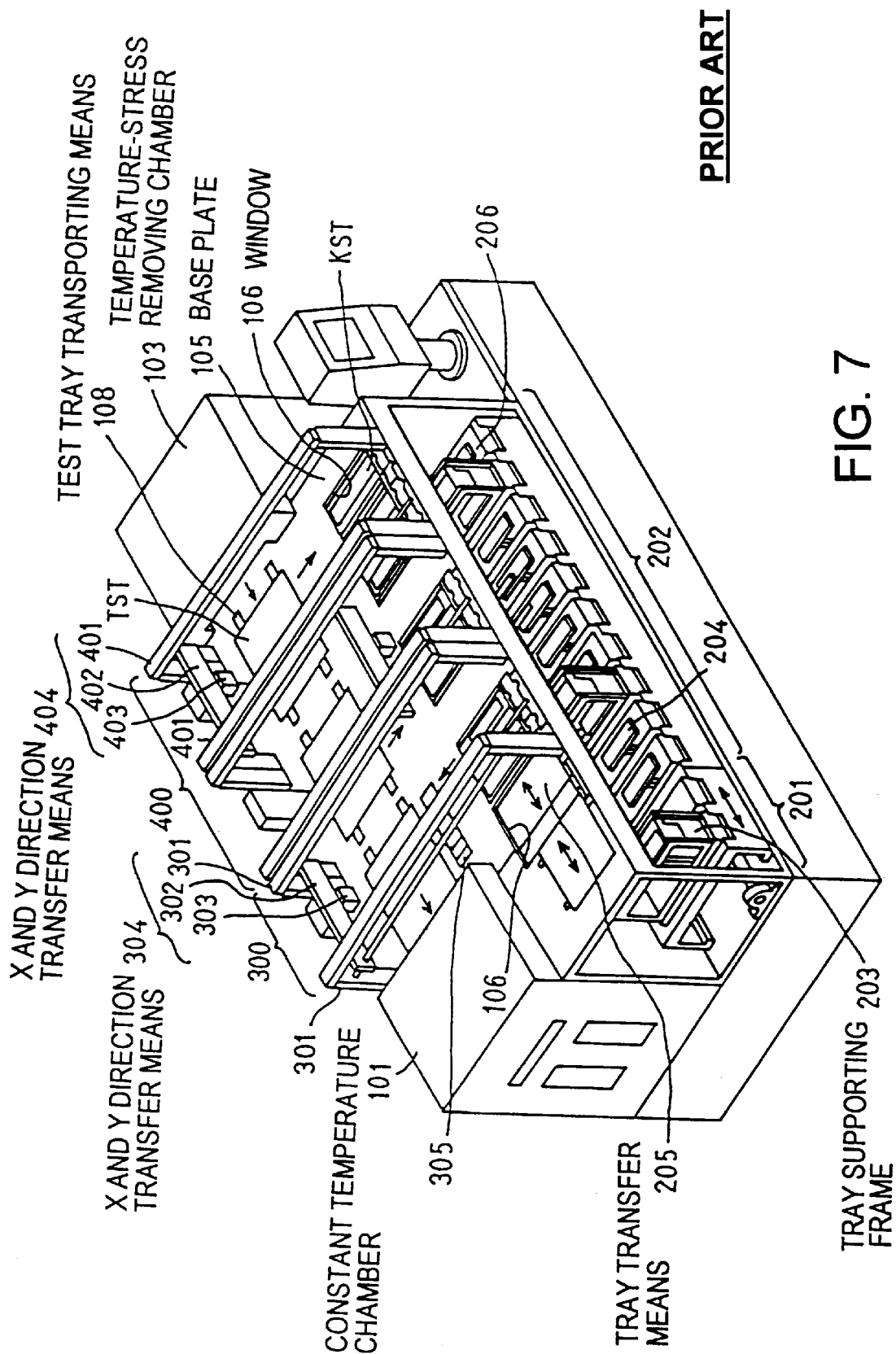
FIG. 7 is a schematic perspective view of the IC testing apparatus shown in FIG. 6.
Figure 8:
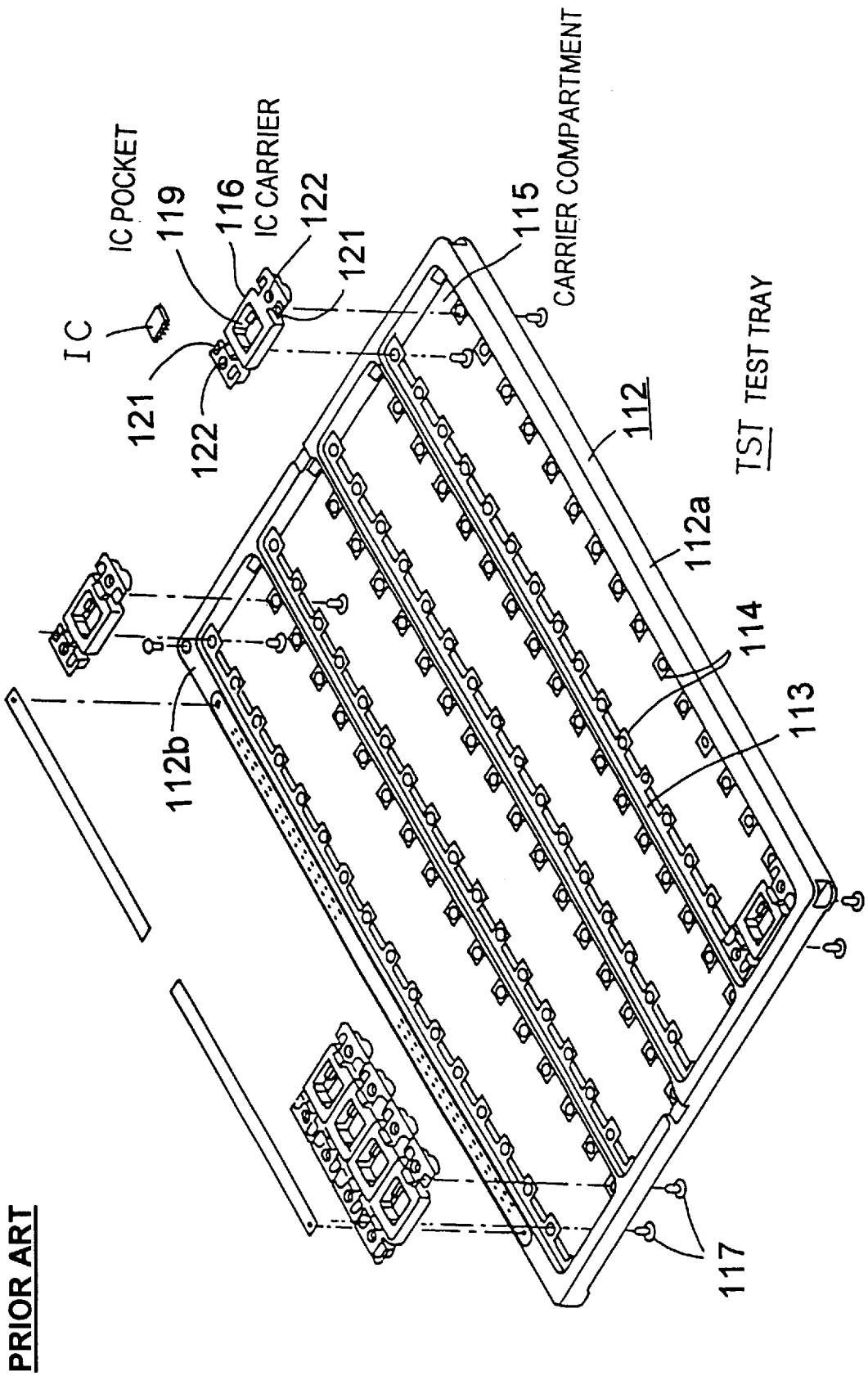
FIG. 8 is an exploded perspective view illustrating an example of the test tray for use with the IC testing apparatus shown in FIGS. 6 and 7.
Figure 9:
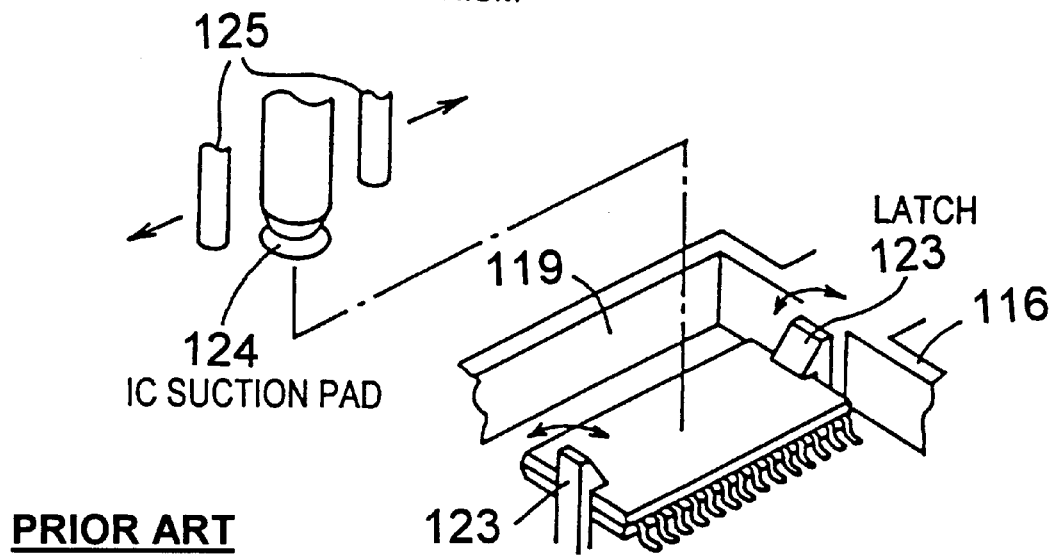
FIG. 9 is a schematic perspective view illustrating how an IC is stored in the test tray shown in FIG. 8.
Figure 10:
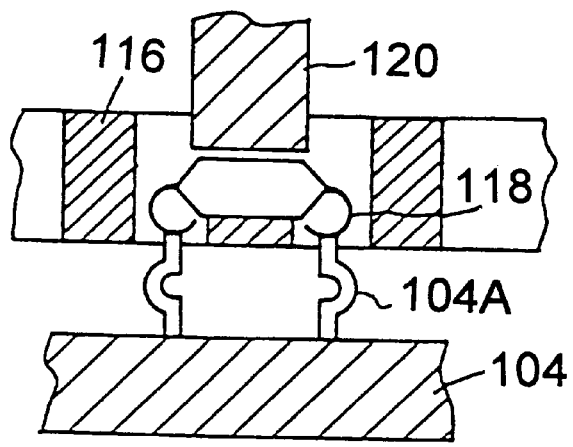
FIG. 10 is an enlarged cross-sectional view illustrating the manner in which the IC under test stored in the test tray shown in FIG. 8 is in electrical contact with the tester head.
Figure 11:
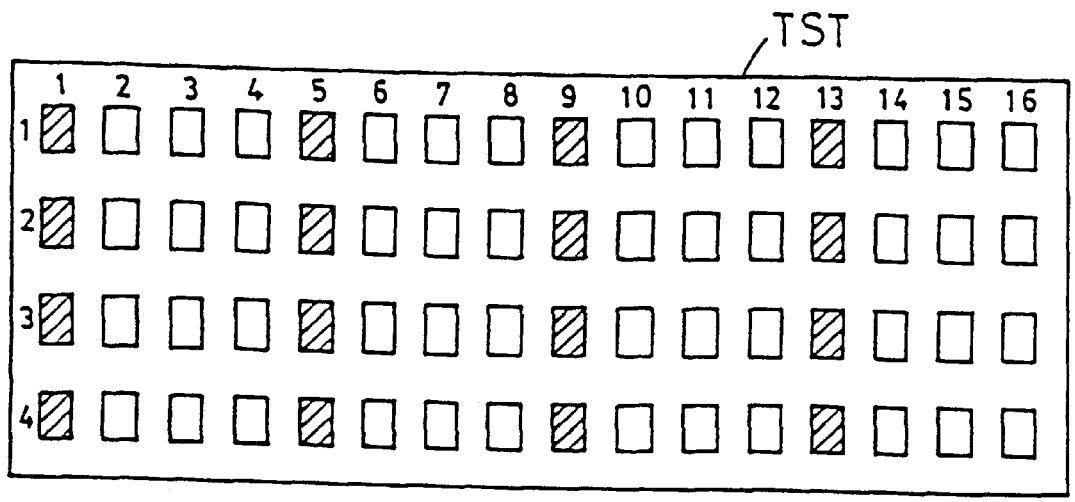
FIG. 11 is a plan view illustrating the sequence in which the ICs stored in a test tray are subjected to testing.
Figure 12:
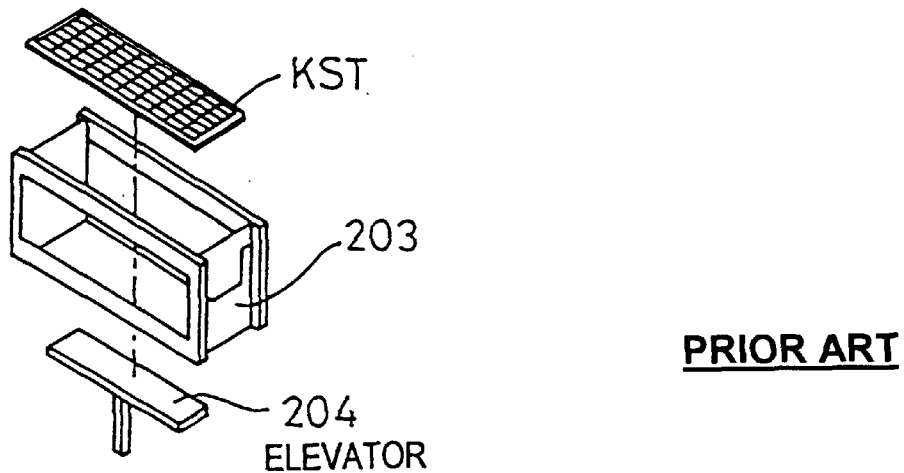
FIG. 12 is an exploded perspective view illustrating the construction of a IC storage rack or a tested IC storage rack for use with the IC testing apparatus.

It will thus be appreciated that in the IC testing apparatus shown in FIGS. 6 and 7, universal trays KST loaded with tested ICs may be stored successively into the tray storage container KAS by applying the tray storing apparatus constructed as described above for use in the unloader section.

While the first and second engagement hooks are illustrated as being spaced apart angularly from each other by 90° in the embodiment described above, the angular spacing between the first and second engagement hooks is not limited to 90° since one of the first and second engagement hooks need only be in a position out of engagement with the tray when the other is in engagement with the tray. Further, while the present invention has been described in the foregoing description taking by example the case in which the invention is applied to the IC testing apparatus for testing ICs typical of semiconductor devices, it is needless to say that the present invention is applicable to testing apparatus for testing semiconductor devices other than ICs with equal functional effects.

As discussed hereinabove, according to the present invention, trays loaded with semiconductor devices to be tested and stored in a tray storage container open only at its bottom may be automatically removed from the tray storage container to deliver the semiconductor devices to a semiconductor device testing apparatus, and trays loaded with semiconductor devices having undergone a test may be returned to a tray storage container open only at its bottom. It is thus to be understood that the present invention provides the marked advantage of allowing for full automation of the operations of delivering semiconductor devices to be tested to a semiconductor device testing apparatus and of recovering tested semiconductor devices from the semiconductor device testing apparatus even if a tray storage container open only at its bottom is used.

What is claimed is:

1. A semiconductor device tray removing apparatus comprising:

a tray storage container supporting section for resting thereon a tray storage container open at the bottom thereof and provided on the end edges of the open bottom with movable hooks, said tray storage container being capable of supporting a predetermined number of trays stacked one on another in the form of a stack by said movable hooks being placed in their engaged position, each tray being loaded with semiconductor devices to be tested;

elevator means disposed below said tray storage container supporting section and adapted to receive said stacked trays discharged from said tray storage container by said movable hooks being placed into their non-engaged position and to move said stacked trays or any one or more trays received thereon vertically;

first engagement hook means movable between an engaged position in which said first engagement hook means is in engagement with any one or more trays as the trays, placed on said elevator means, move vertically and a non-engaged position in which said first engagement hook means is not in engagement with any one or more trays;

second engagement hook means disposed at an elevation lower than said first engagement hook means by a distance corresponding to one thickness of the tray, and movable between an engaged position in which said second engagement hook means is in engagement with any one or more trays as the trays, placed on said elevator means, move vertically and a non-engaged position in which said second engagement hook means is not in engagement with any one or more trays;

control means performing, in a predetermined sequence, the control operation of moving said first engagement hook means to said engaged position, lowering said elevator means to engage the lowermost one of said stacked trays rested on said elevator means with said first engagement hook means to thereby support said stacked trays by said first engagement hook means, the control operation of bringing said elevator means into abutment against the bottom surface of the lowermost one of said stacked trays while in this condition moving said first engagement hook means to said non-engaged position and moving said second engagement hook means to said engaged position, the control operation of lowering said elevator means to engage the lowermost one of said stacked trays with said second engagement hook means to thereby support said stacked trays by said second engagement hook means, the control operation, in the condition described just above, of moving said first engagement hook means to said engaged position so as to engage with the second lowermost one of said stacked trays while moving said second engagement hook means to said non-engaged position, and the control operation, in the condition described just above, of lowering said elevator means to lower only the lowermost one of said stacked trays; and transfer means for receiving said one tray lowered to a predetermined position by said elevator means and delivering said one tray to a semiconductor device testing apparatus.

2. The semiconductor device tray removing apparatus according to claim 1, wherein said first and second engagement hook means disposed at elevations different by a distance corresponding to one thickness of the tray comprise a pair of integrally joined pivotable pawls extending in different directions such that one of said pawls is in said engaged position when the other pawl is in said non-engaged position and are pivotable about an as intersecting perpendicularly with the plane of the tray; and wherein each of said trays is generally rectangular and formed in opposed side surfaces thereof with recesses adapted to be engageable with said first and second engagement hook means, each of said recesses being open downwardly.

3. The semiconductor device tray removing apparatus according to claim 1, wherein said control means controls:

upon said tray storage container being rested on said tray storage container supporting section, to move said first engagement hook means to said engaged position and to move said elevator means upwardly into abutment against the bottom surface of the lowermost one of said stacked trays;

upon said elevator means receiving said stacked trays as they are discharged from said tray storage container while said elevator means is still in abutment against the bottom surface of the lowermost one of said stacked trays, to lower said elevator means to engage the lowermost one of said stacked trays with said first engagement hook means to thereby support said stacked trays by said first engagement hook means;

then to bring said elevator means into abutment against the bottom surface of the lowermost one of said stacked trays, and with said elevator means maintained in abutment against the bottom surface, to move said first engagement hook means to said non-engaged position and at the same time to move said second engagement hook means to said engaged position;

then to lower said elevator means by a distance corresponding to one thickness of the tray to engage the lowermost one of said stacked trays with said second engagement hook means to thereby support said stacked trays by said second engagement hook means while maintaining said elevator means in abutment against the bottom surface of the lowermost one of said stacked trays, then to move said first engagement hook means to said engaged position so as to engage with the second lowermost one of said stacked trays and to move said second engagement hook means to said non-engaged position to thereby support the lowermost one tray by said elevator means; and then to lower said elevator means to lower only the lowermost one of said stacked trays to a predetermined position.

4. A semiconductor device tray storing apparatus comprising:

a tray storage container supporting section for resting thereon a tray storage container open at the bottom thereof and provided on the end edges of the open bottom with movable hooks, said tray storage container being capable of supporting a predetermined number of trays stacked one on another in the form of a stack by said movable hooks being placed in their engaged position, each tray being loaded with tested semiconductor devices;

elevator means disposed below said tray storage container supporting section and adapted to receive a tray delivered by transfer means of a semiconductor device testing apparatus, said tray being loaded with tested semiconductor devices, and then to lift trays successively one by one;

first engagement hook means movable between an engaged position in which said first engagement hook means is in engagement with a tray as said tray, placed on said elevator means, moves upwardly and a non-engaged position in which said first engagement hook means is not in engagement with said tray;

second engagement hook means disposed at an elevation higher than said first engagement hook means by a distance corresponding to one thickness of the tray, and movable between an engaged position in which said second engagement hook means is in engagement with a tray as said tray, placed on said elevator means, moves upwardly and a non-engaged position in which said second engagement hook means is not in engagement with said tray; and control means performing, in a predetermined sequence, the first control operation of moving said first engagement hook means to said non-engaged position, raising said elevator means to lift the tray placed on said elevator means up to the elevation of said second engagement hook means and then moving said second engagement hook means to said engaged position to engage with said tray placed on said elevator means to thereby support said tray by said second engagement hook means, the second control operation of raising said elevator means carrying the next succeeding tray thereon into abutment against the bottom surface of the preceding tray supported by said second engagement hook means while in this condition moving said first engagement hook means to said engaged position to engage with the lower succeeding tray and moving said second engagement hook means to said non-engaged position, the third control operation, in the condition described just above, of raising said elevator means by a distance corresponding to one thickness of the tray and moving said second engagement hook means to said engaged position to engage with said lower tray to thereby support the stacked trays by said second engagement hook means, and the fourth control operation of, upon said second and third control operations being repeated until a predetermined number of trays are stacked one on another on said elevator means, moving said elevator means to store the stacked trays into said tray storage container.

5. The semiconductor device tray storing apparatus according to claim 4, wherein said first control operation by said control means includes moving said first engagement hook means to said non-engaged position, raising said elevator means to lift the tray placed on said elevator means up to the elevation of said first engagement hook means and then moving said first engagement hook means to said engaged position to engage with said tray placed on said elevator means to thereby support said tray by said first engagement hook means, and in this condition, further raising said elevator means by a distance corresponding to one thickness of the tray and then moving said second engagement hook means to said engaged position to engage with said tray placed on said elevator means to thereby support said tray by said second engagement hook means.

6. The semiconductor device tray storing apparatus according to claim 4, wherein said first and second engagement hook means disposed at elevations different by a distance corresponding to one thickness of the tray comprise a pair of integrally joined pivotable pawls extending in different directions such that one of said pawls is in said engaged position when the other pawl is in said non-engaged position and are pivotable about an axis intersecting perpendicularly with the plane of the tray; and wherein each of said trays is generally rectangular and formed in opposed side surfaces thereof with recesses adapted to be engageable with said first and second engagement hook means, each of said recesses being open downwardly.

7. The semiconductor device tray storing apparatus according to claim 5, wherein said first and second engagement hook means disposed at elevations different by a distance corresponding to one thickness of the tray comprise a pair of integrally joined pivotable pawls extending in different directions such that one of said pawls is in said engaged position when the other pawl is in said non-engaged position and are pivotable about an axis intersecting perpendicularly with the plane of the tray; and wherein each of said trays is generally rectangular and formed in opposed side surfaces thereof with recesses adapted to be engageable with said fist and second engagement hook means, each of said recesses being open downwardly.

* * * * *